United States Patent
Wyrzykowska et al.

(10) Patent No.: US 7,409,020 B1
(45) Date of Patent: Aug. 5, 2008

(54) TECHNIQUE FOR FILTER-ENHANCED CLOCK SYNCHRONIZATION

(75) Inventors: Aneta Wyrzykowska, Dunrobin (CA); Kah Ming Soh, Kanata (CA); James Aweya, Kanata (CA); Delfin Montuno, Kanata (CA); Michel Ouellette, Plantagenet (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 766 days.

(21) Appl. No.: 10/732,532

(22) Filed: Dec. 11, 2003

(51) Int. Cl.
*H04B 1/10* (2006.01)

(52) U.S. Cl. .................. 375/350; 375/345; 375/359; 375/362

(58) Field of Classification Search .......... 375/345–350, 375/354–362
See application file for complete search history.

(56) References Cited

U.S. PATENT DOCUMENTS 6,696,886 B1 * 2/2004 Ke et al. ............... 327/553
2003/0056136 A1 * 3/2003 Aweya et al. ......... 713/400

* cited by examiner

*Primary Examiner*—Curtis B Odom
(74) *Attorney, Agent, or Firm*—Hunton & Williams LLP

(57) ABSTRACT

A technique for filter-enhanced clock synchronization is disclosed. In one particular exemplary embodiment, the technique may be realized by/as a method for filter-enhanced clock synchronization. The method comprises subjecting a clock error signal to a first exponentially weighted moving average (EWMA) filter to generate a first output signal, where the first EWMA filter comprises a first gain element. And the method further comprises subjecting the first output signal to a second EWMA filter to generate a second output signal, where the second EWMA filter comprises a second gain element and the second EWMA filter is coupled with a feedback loop having a delay element and a summing junction.

17 Claims, 13 Drawing Sheets

TECHNIQUE FOR FILTER-ENHANCED CLOCK SYNCHRONIZATION

FIELD OF THE INVENTION

The present invention relates generally to computer and communications networks and, more particularly, to a technique for filter-enhanced clock synchronization.

BACKGROUND OF THE INVENTION

Clock synchronization in a communications network is the means by which a clock signal is generated or derived and distributed through the network and its individual nodes for the purpose of ensuring synchronized network operation. Two main performance degradation issues come into play when clocks at a transmitter and a receiver are not synchronized. First, if the physical interfaces along a connection are not synchronized (i.e., not driven by a clocking signal of identical frequency), data can be lost due to buffer overflow or underflow, resulting in periodic line errors. Second, imperfections in clock synchronization can lead to observable defects on an end service such as bit errors due to alignment jitter or frame slips.

In packet switched networks such as IP/Ethernet where essentially an asynchronous transmission service is provided, the synchronization needs of real-time applications are difficult to meet. Many techniques have been proposed to effectuate clock synchronization in a packet switched network. In one approach, a receiver may derive an estimate of the transmitter clock from the received data stream. For example, a transmitter may send an explicit time indication or timestamp (e.g., in a packet with or without user data) to a receiver so that it can synchronize its local clock to that of the transmitter. Since no common network clock is used, the receiver relies on locking a recovered clock to the arrival of the timestamp patterns. This is commonly done using a phase-locked loop (PLL) that slaves the receiver clock to a transmitter clock. The PLL is able to process transmitted clock samples encoded within the data stream, or process data arrival patterns to generate a timing signal for the receiver. The purpose of the PLL is to estimate and compensate for the frequency drift occurring between the oscillators of the transmitter clock and the receiver clock. Unfortunately, the presence of transmission jitter affects the performance of the clock estimation/compensation process, making the transmitter clock appear faster or slower than it actually is, and ultimately, causing the propagation of some residual jitter to the receiver clock signal. The presence of even a modest amount of jitter makes the clock recovery problem difficult. The design of the PLL must ensure that clock impairments are within acceptable limits for the intended applications.

One significant problem with existing PLL clock recovery circuits arises from the poor performance of their loop filters. When a loop filter fails to effectively suppress the high frequency component of the detected clock error, the PLL will not acquire or maintain a true lock to the transmitter frequency. This problem may be best understood with reference to FIGS. 1 through 3.

In FIG. 1, there is shown a loop filter 10 comprising a double exponentially weighted moving average (EWMA) filter. The double EWMA filter comprises a first EWMA filter 11 cascaded with a second EWMA filter 12. The first EWMA filter 11 comprises a first multiplying element 100, a summing junction 102, a delay element 104, a second multiplying element 106, a differencing element 108, a constant element 110 and a gain element 112. Similarly, the second EWMA filter 12 comprises a first multiplying element 114, a summing junction 116, a delay element 118, a second multiplying element 120, a differencing element 122, a constant element 124 and a gain element 126.

In practice, a detected clock error signal e(n) is fed to the input of EWMA filter 11, a first output signal s(n) is generated at the output of EWMA filter 11, and a second output signal u(n) is generated at the output of EWMA filter 12, where integer n indicates the arrival time of the $n^{th}$ timestamp. These signals have the following relationship:

$$s(n)=\alpha_1 * e(n)+(1-\alpha_1)*s(n-1)$$

$$u(n)=\alpha_2 * s(n)+(1-\alpha_2)*u(n-1)$$

where $\alpha_1$ and $\alpha_2$ can be tuned to achieve an optimized loop filter response. Theoretically, if the high frequency component of e(n) can be removed by loop filter 10, the frequency of timestamp generation can be estimated to an arbitrary degree of accuracy. However, in reality, even with both $\alpha_1$ and $\alpha_2$ optimized, a continual build-up of phase error can still be observed. As a result, the PLL will never truly lock to the transmitter clock frequency. FIG. 2 shows the build-up of phase error in a PLL incorporating loop filter 10. FIG. 3 shows the frequency response of such a PLL where waveform 302 is the transmitter frequency and waveform 304 is the PLL output frequency. It can be seen that waveform 304 fails to trace the transmitter frequency.

In view of the foregoing, it would be desirable to provide a technique for clock synchronization which overcomes the above-described inadequacies and shortcomings.

SUMMARY OF THE INVENTION

According to the present invention, a technique for filter-enhanced clock synchronization is provided. In one particular exemplary embodiment, the technique may be realized by/as a method for filter-enhanced clock synchronization. The method comprises subjecting a clock error signal to a first exponentially weighted moving average (EWMA) filter to generate a first output signal, where the first EWMA filter comprises a first gain element. And the method further comprises subjecting the first output signal to a second EWMA filter to generate a second output signal, where the second EWMA filter comprises a second gain element and the second EWMA filter is coupled with a first feedback loop having a first delay element and a first summing junction.

In accordance with other aspects of this particular exemplary embodiment of the present invention, at least one of the first gain element and the second gain element is a tunable gain element.

In accordance with further aspects of this particular exemplary embodiment of the present invention, the method may further comprise tuning at least one of the first gain element and the second gain element to achieve a desired response time and performance for the second output signal.

In accordance with additional aspects of this particular exemplary embodiment of the present invention, the method may further comprise coupling second feedback loop to the first EWMA filter, where the second feedback loop comprises a third gain element, a second delay element and a second summing junction. The third gain element may be a tunable gain element. And the method may further comprise tuning the third gain element, in addition to the first gain element and the second gain element, to achieve a desired response time and performance for the second output signal.

In accordance with another aspect of this particular exemplary embodiment of the present invention, the first feedback loop may comprise a fourth gain element. And the fourth gain element may be a tunable gain element.

In yet another particular exemplary embodiment, the technique may be realized by at least one computer readable medium for storing instructions configured to be readable by at least one processor for instructing the at least one processor to execute a computer process for performing the method as recited above.

In still another particular exemplary embodiment, the technique may be realized by/as an apparatus for filter-enhanced clock synchronization. The apparatus comprises a first exponentially weighted moving average (EWMA) filter, where the first EWMA filter comprises a first gain element and a second EWMA filter to generate a second output signal, where the second EWMA filter comprises a second gain element and the second EWMA filter is coupled with a first feedback loop having a first delay element and a first summing junction.

In accordance with other aspects of this particular exemplary embodiment of the present invention, at least one of the first gain element and the second gain element is a tunable gain element.

In accordance with further aspects of this particular exemplary embodiment of the present invention, at least one of the first gain element and the second gain element is tuned to achieve a desired response time and performance for the second output signal.

In accordance with additional aspects of this particular exemplary embodiment of the present invention, the apparatus may further comprise a second feedback loop coupled to the first EWMA filter, where the second feedback loop comprises a third gain element, a second delay element and a second summing junction. The third gain element may be a tunable gain element. And the third gain element may be tuned, in addition to the first gain element and the second gain element, to achieve a desired response time and performance for the second output signal.

In accordance with another aspect of this particular exemplary embodiment of the present invention, the first feedback loop may comprise a fourth gain element. And the fourth gain element may be a tunable gain element.

The present invention will now be described in more detail with reference to exemplary embodiments thereof as shown in the accompanying drawings. While the present invention is described below with reference to exemplary embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the accompanying drawings, in which like elements are referenced with like numerals. These drawings should not be construed as limiting the present invention, but are intended to be exemplary only.

DETAILED DESCRIPTION OF EXEMPLARY EMBODIMENT(S)

Figure 4:
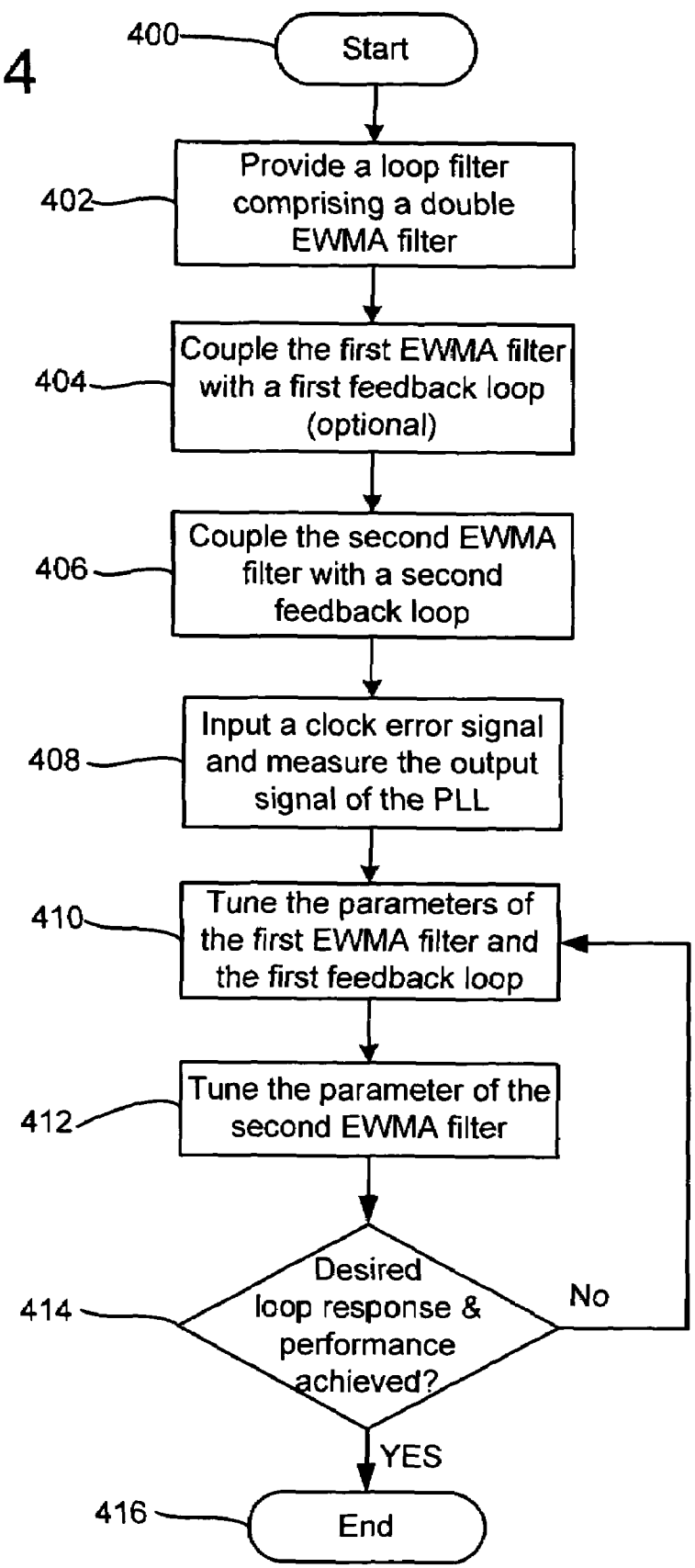
FIG. 4 is a flow chart illustrating an exemplary method for filter-enhanced clock synchronization in accordance with the present invention.

Referring to FIG. 4, there is shown a flow chart illustrating an exemplary method for filter-enhanced clock synchronization in accordance with the present invention.

The exemplary method starts in step 400.

Figure 1:
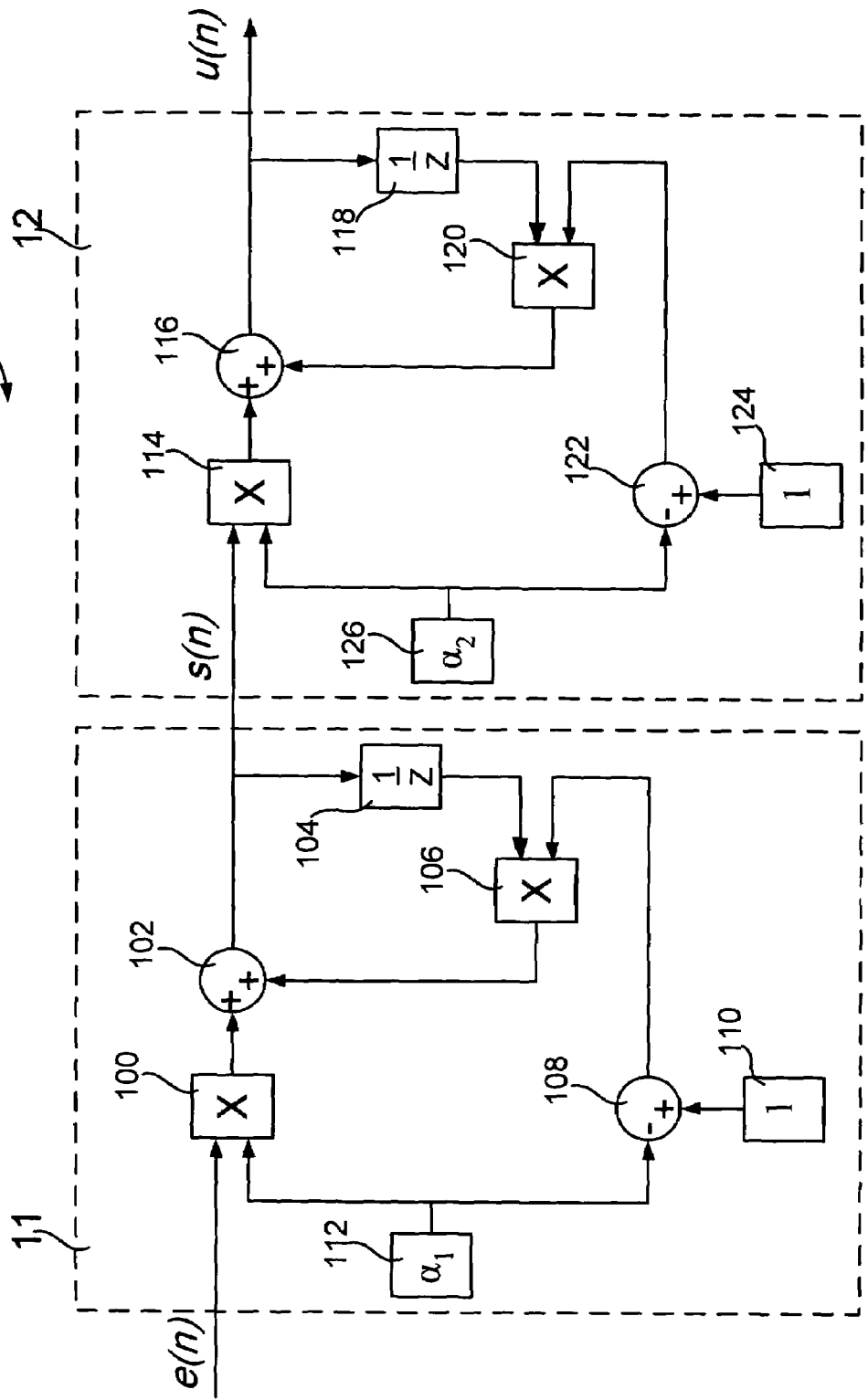
FIG. 1 is a circuit schematic illustrating a prior art loop filter utilized in clock synchronization.
Figure 2:
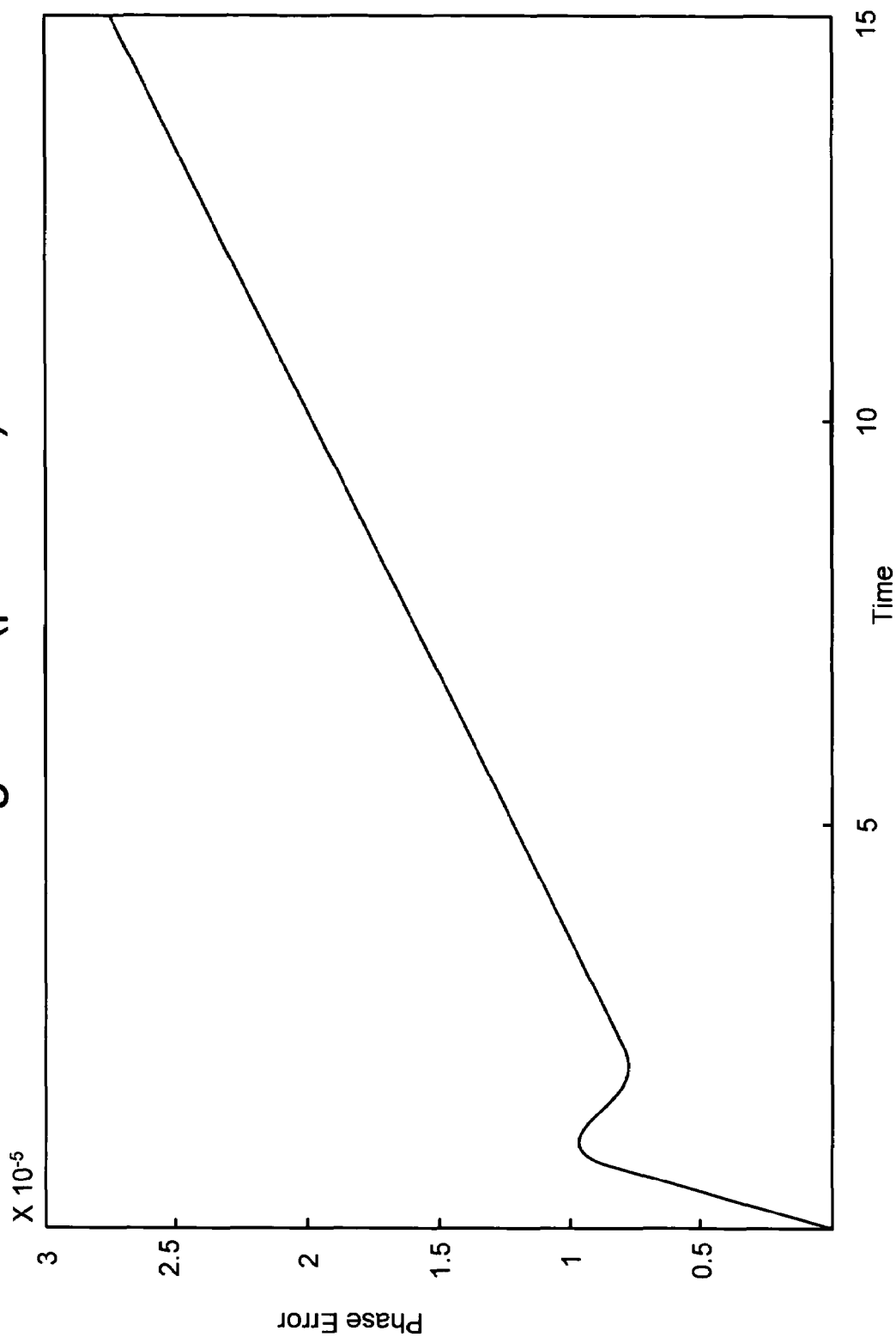
FIG. 2 illustrates the phase errors of the prior art loop filter.
Figure 3:
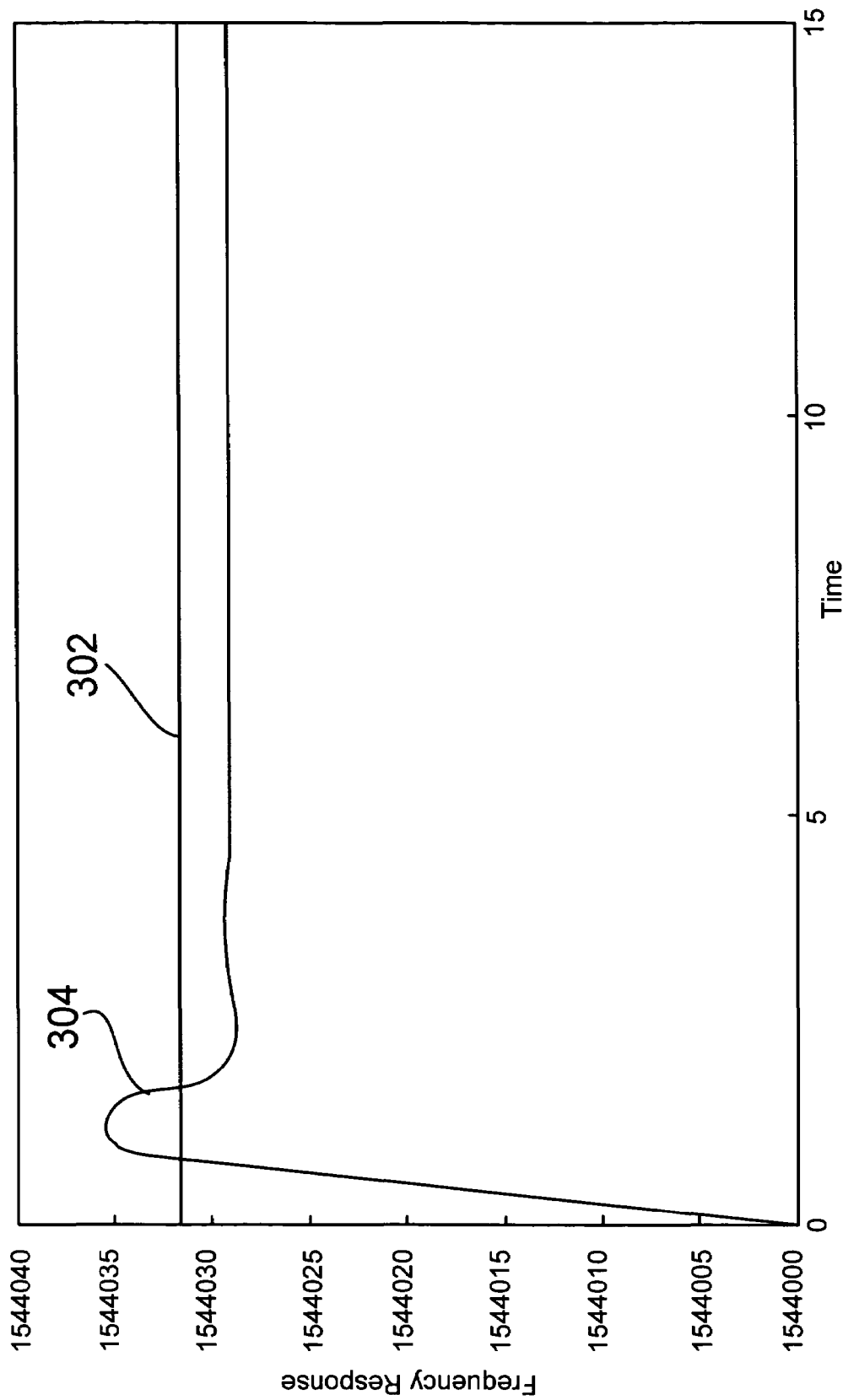
FIG. 3 illustrates the frequency response of the prior art loop filter.
Figure 5:
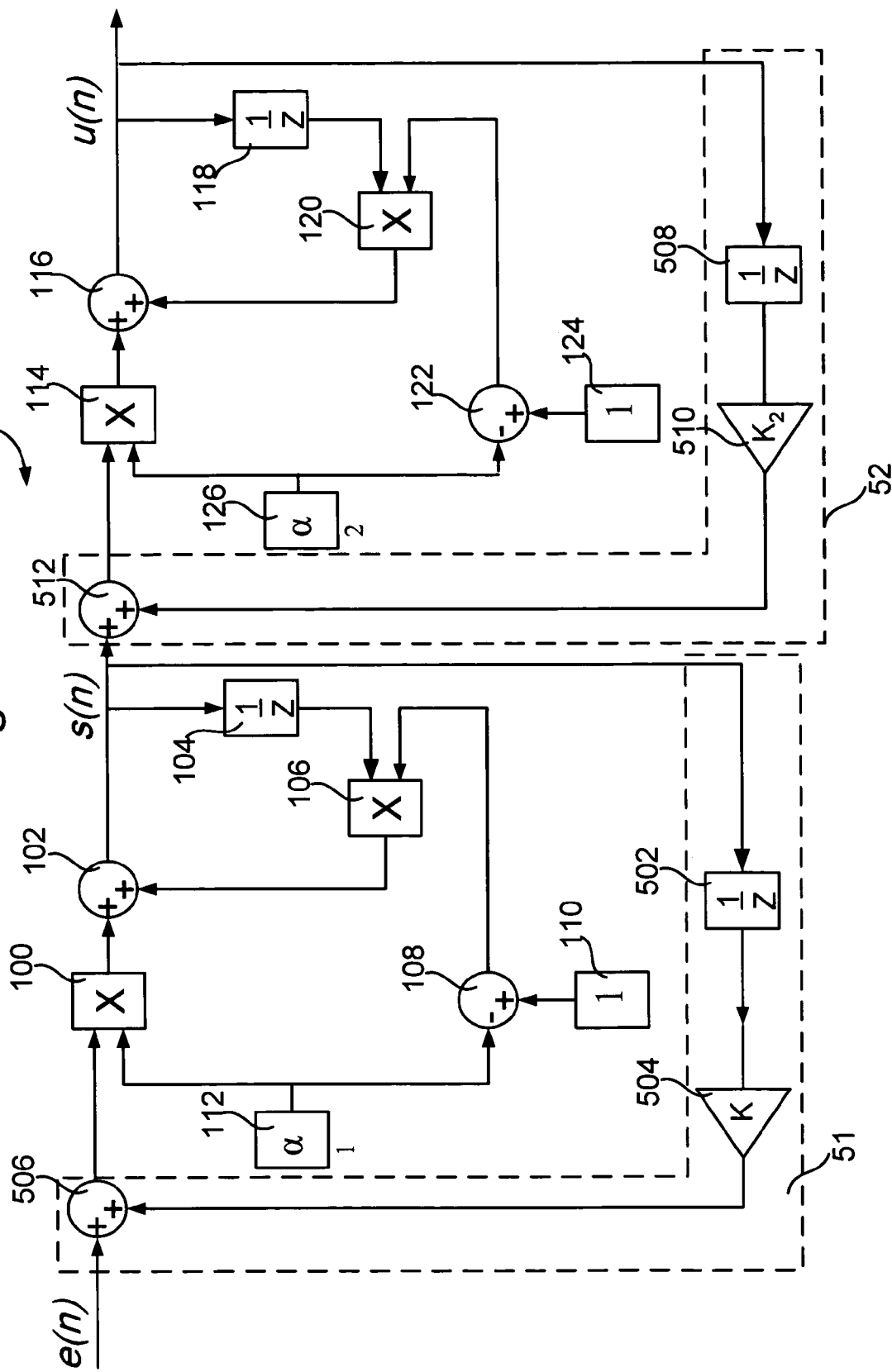
FIG. 5 is a circuit schematic illustrating a loop filter in accordance with the present invention.

In step 402, a loop filter comprising a double EWMA filter may be provided in a phase-locked loop (PLL). The loop filter may be positioned between a phase detector and a voltage controlled oscillator (VCO) (or digitally controlled oscillator (DCO)). The loop filter, an example of which is shown in FIG. 5, may be based on the double EWMA filter shown in FIG. 1. In FIG. 5, the loop filter 50 comprises two cascaded EWMA filters. An EWMA filter is a circuit that can generate a smooth estimate of an input signal by applying a currently observed input signal to a previous estimate. As a result, the high frequency part of the input signal may be filtered out and its DC part may be retained.

In step 404, a first feedback loop 51 may be optionally coupled to the first EWMA filter. As shown in FIG. 5, the feedback loop 51 may comprise a delay element 502, a gain element 504 and a summing junction 506. Feedback loop 51 bridges the input and output of the first EWMA filter. As a result, the output signal s(n) of the first EWMA filter will be $$s(n)=\alpha_1 * e(n)+[1-\alpha_1 *(1-K)]*s(n-1)$$

where $\alpha_1$ is the gain factor of gain element 112 and K is the gain factor of gain element 504. $\alpha_1$ typically has a positive value that is less than 1. Depending on the value of K, feedback loop 51 may provide either positive or negative feedback to the first EWMA filter. $\alpha_1$ and K may be tuned to vary the response and performance of the first EWMA filter. The effects of $\alpha_1$ and K will be described in detail below.

In step 406, a second feedback loop 52 may be coupled to the second EWMA filter. As shown in FIG. 5, the feedback loop 52 may comprise a delay element 508, a gain element 510 and a summing junction 512. Feedback loop 52 bridges the input and output of the second EWMA filter. As a result, the output signal u(n) of the second EWMA filter will be $$u(n)=\alpha_2 * s(n)+[1-\alpha_2 *(1-K_2)]*u(n-1)$$

where $\alpha_2$ is the gain factor of gain element 126 and $K_2$ is the gain factor of gain element 510. $\alpha_2$ typically has a positive value that is less than 1. Feedback loop 52 provides a positive feedback to the second EWMA filter. $\alpha_2$ may be tuned to vary the response and performance of the second EWMA filter.

The effect of $\alpha_2$ will be described in detail below. The gain factor $K_2$ may have a tuning effect on the second EWMA filter in a way similar to that of K on the first EWMA filter. Without losing generality, $K_2$ is set to be 1 in the description below so that $$u(n)=\alpha_2*s(n)+(1)*u(n-1).$$

In step 408, a clock error signal e(n) may be input to the loop filter 50. The clock error signal may be a signal representing a frequency difference between the transmitter clock and the receiver clock. The clock error signal may have been detected by a preceding phase detector in the PLL circuitry. The clock error signal e(n) may be subject to loop filter 50, whose output signal u(n) may be fed further through the PLL. The output signal of the PLL may be measured, e.g., for its loop response and performance.

In step 410, the parameters of the first EWMA filter and the first feedback loop 51 may be tuned. According to embodiments of the invention, it may be desirable to tune $\alpha_1$ and K to improve the time response of the first EWMA filter and thus the overall time response of the PLL.

Figure 6:
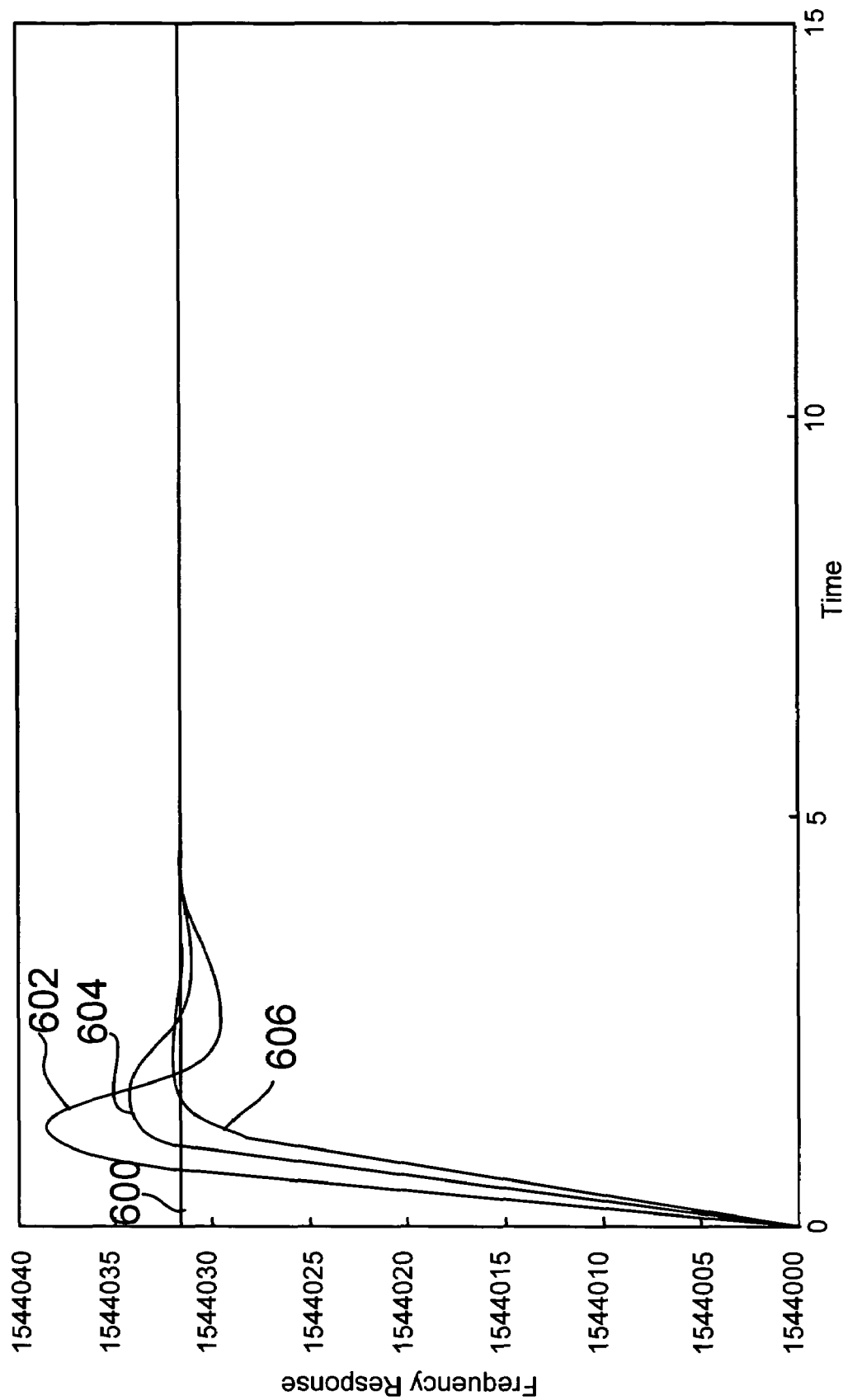
FIG. 6 illustrates a frequency response of a PLL in accordance with the present invention.
Figure 7:
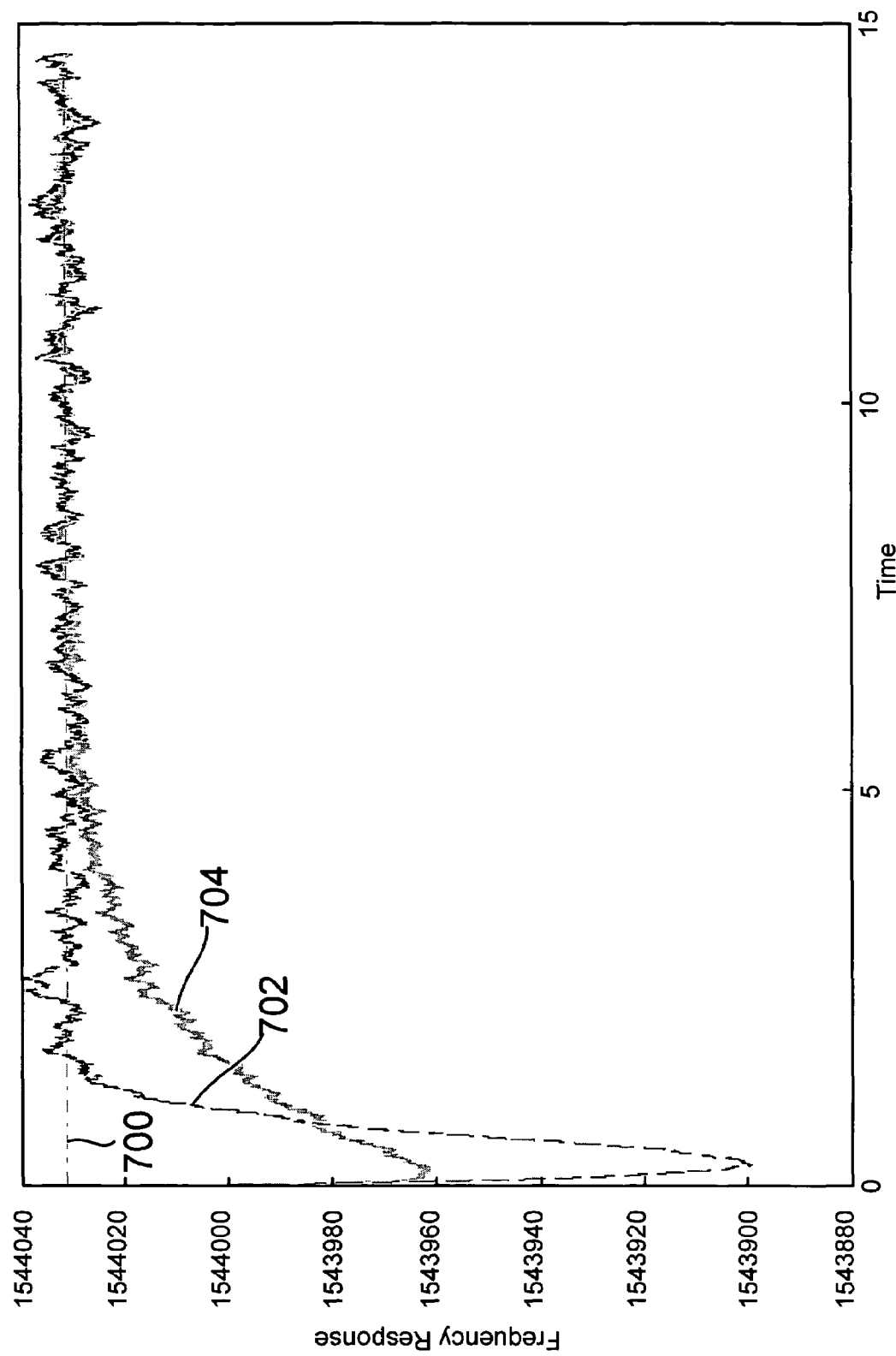
FIG. 7 illustrates a frequency response of another PLL in accordance with the present invention.
Figure 8:
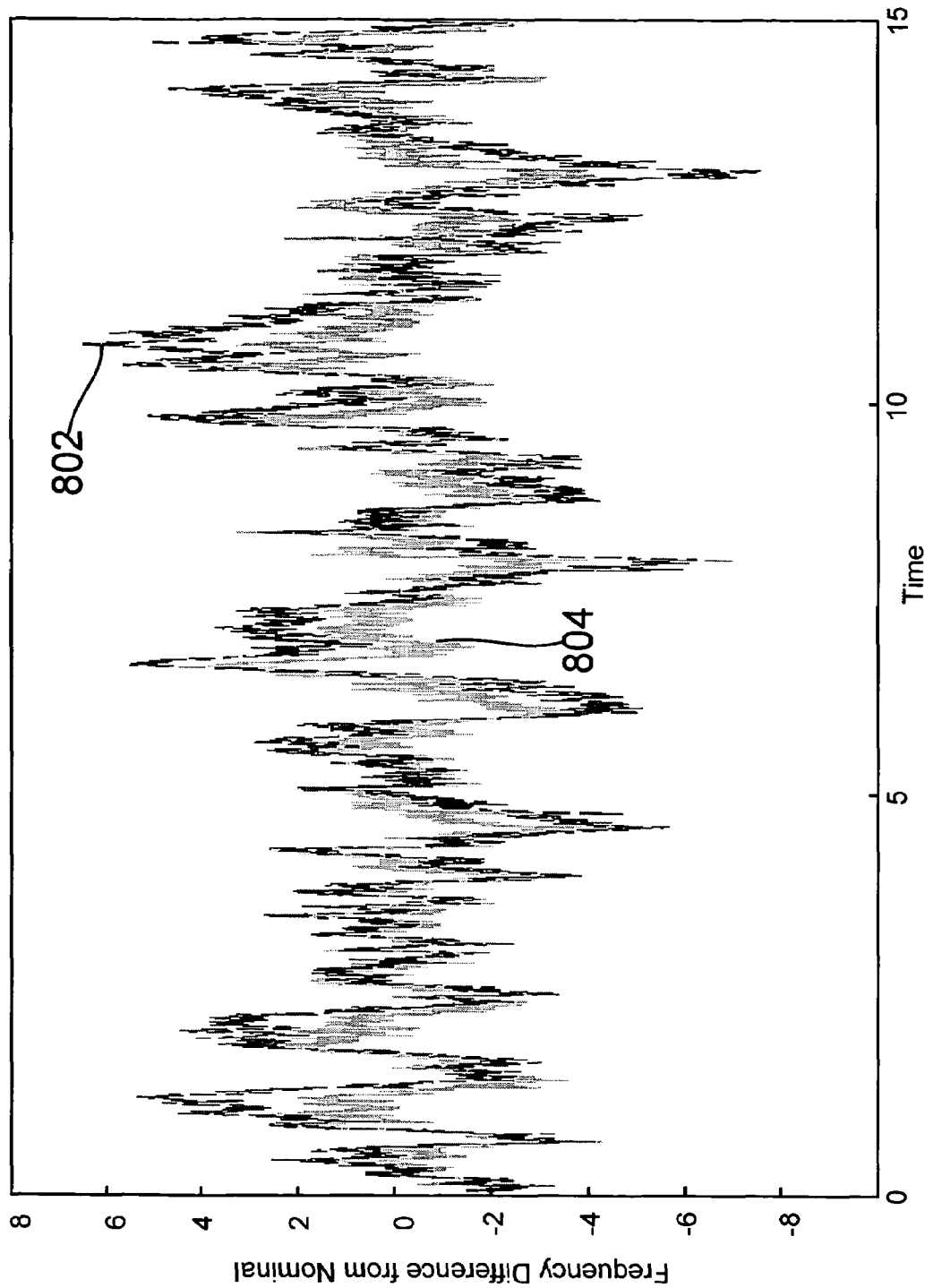
FIG. 8 illustrates the frequency differences from nominal for a loop filter in accordance with the present invention.

For example, if the value of K is decreased to below zero, the feedback loop 51 may have a damping effect on the first EWMA filter. As a result, the PLL may exhibit a faster frequency response. One example is shown in FIG. 6, where waveform 600 represents the transmitter frequency, waveform 602 represents the PLL frequency response when K=0, waveform 604 represents the PLL frequency response when K=−0.5, and waveform 606 represents the PLL frequency response when K=−1. The waveforms shows a trend towards faster loop lock response when K is decreased. Another example is shown in FIG. 7, where the frequency response 702 of the PLL when K=−0.72 is compared to the frequency response 704 when K=0 (i.e., without the optional feedback loop 51). Waveform 700 represents the transmitter frequency. In this example, $\alpha_1$=0.005, $\alpha_2$=0.00001 and there is approximately 200 microsecond (μs) jitter. As can be seen, by introducing negative feedback to the first EWMA filter, the response time compared to the previously optimized case (when K=0) may be improved from 15 sec to 5 sec in a low jitter environment. However, this improvement in response time may be at the expense of a frequency deviation at steady state. Referring to FIG. 8, there is shown the frequency differences from nominal for the K=−0.72 (waveform 802) and K=0 (waveform 804) cases. The steady state maximum offset from the transmitter frequency increased from 3 ppm (parts per million) to 5 ppm after the feedback loop 51 with K=−0.72 is coupled to the first EWMA filter. This may be a sign of trade-off between PLL response time and PLL frequency lock deviation when only the K factor is being tuned.

Figure 9:
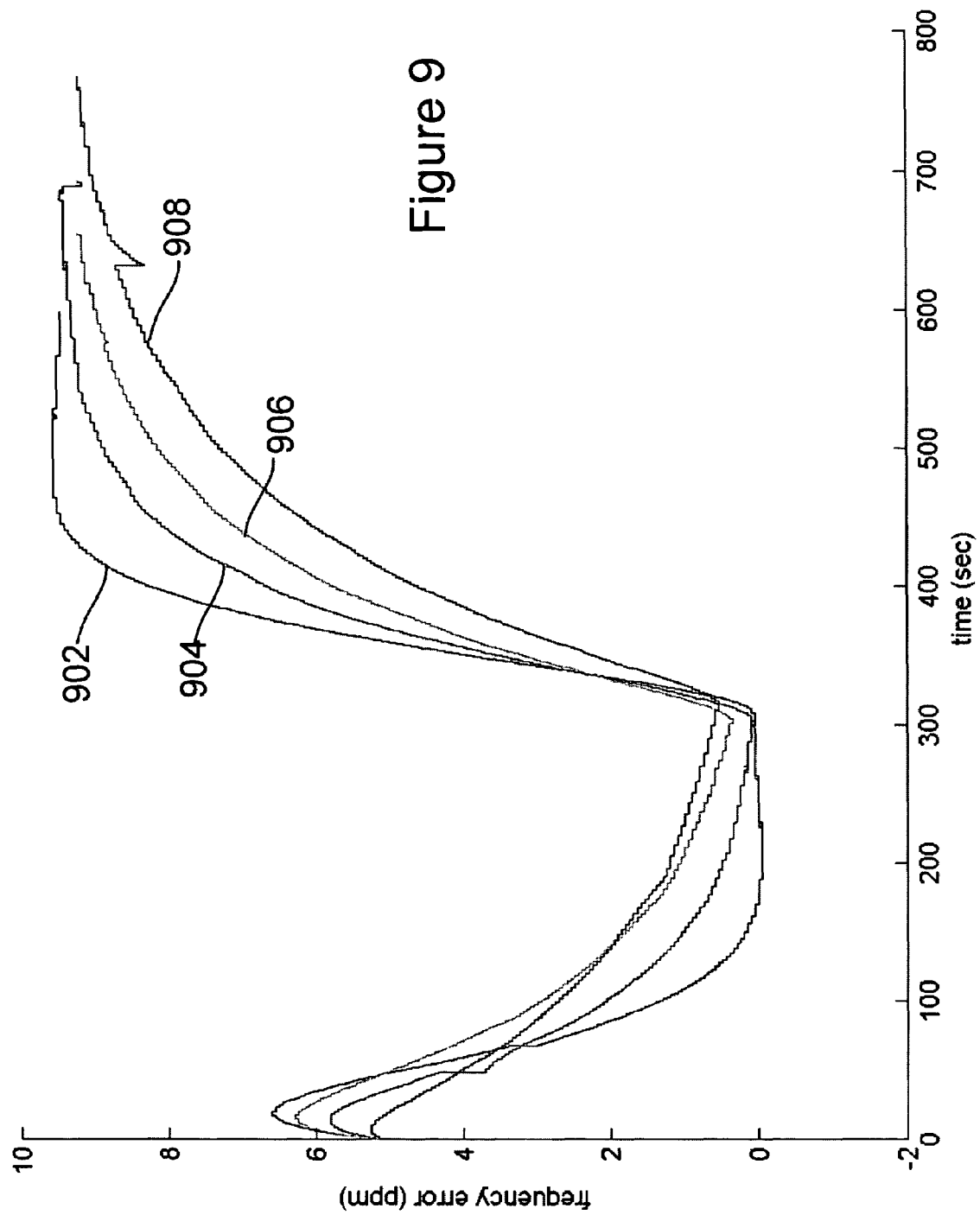
FIG. 9 illustrates the frequency errors of a loop filter in accordance with the present invention.
Figure 10:
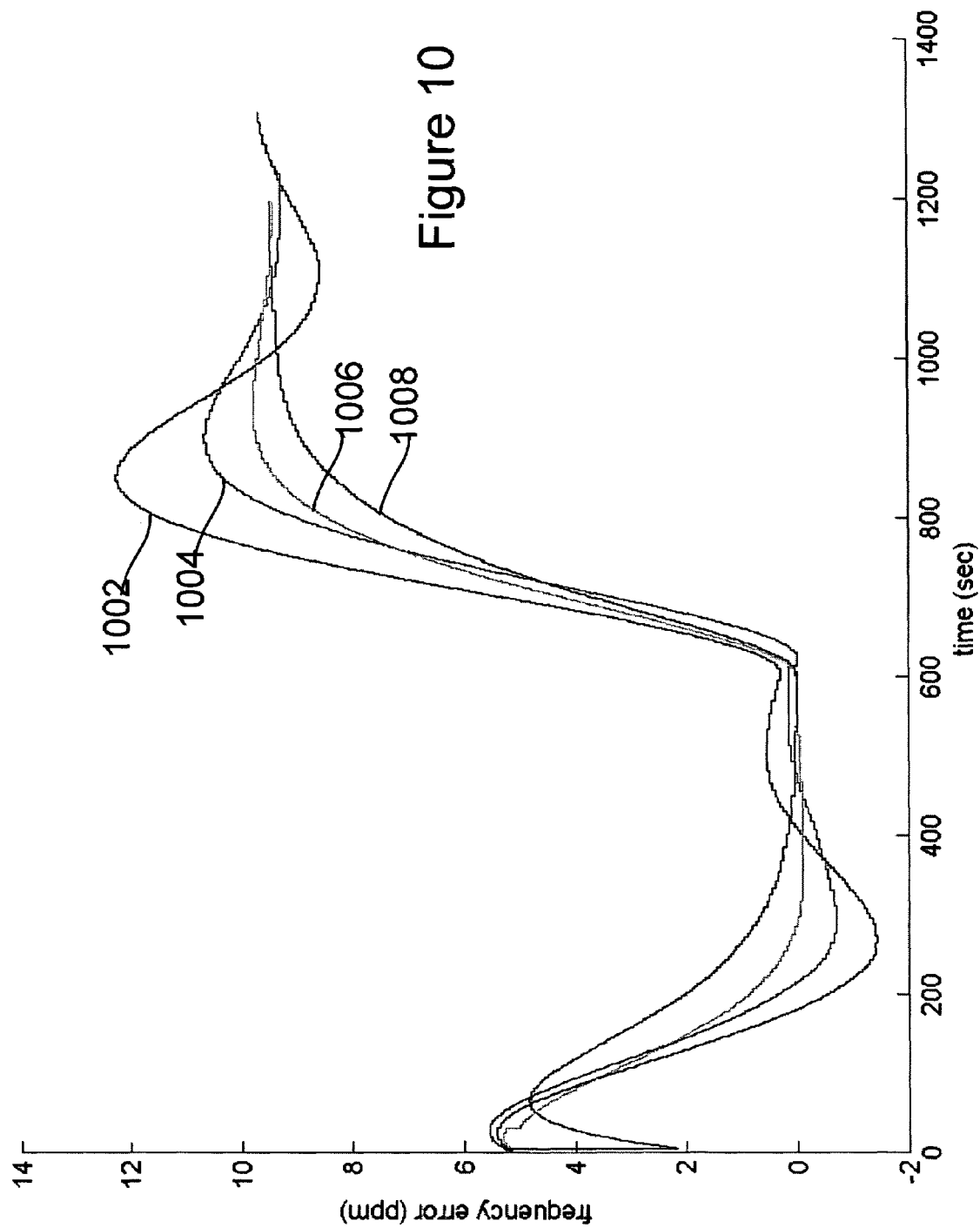
FIG. 10 illustrates the frequency errors of another loop filter in accordance with the present invention.
Figure 11:
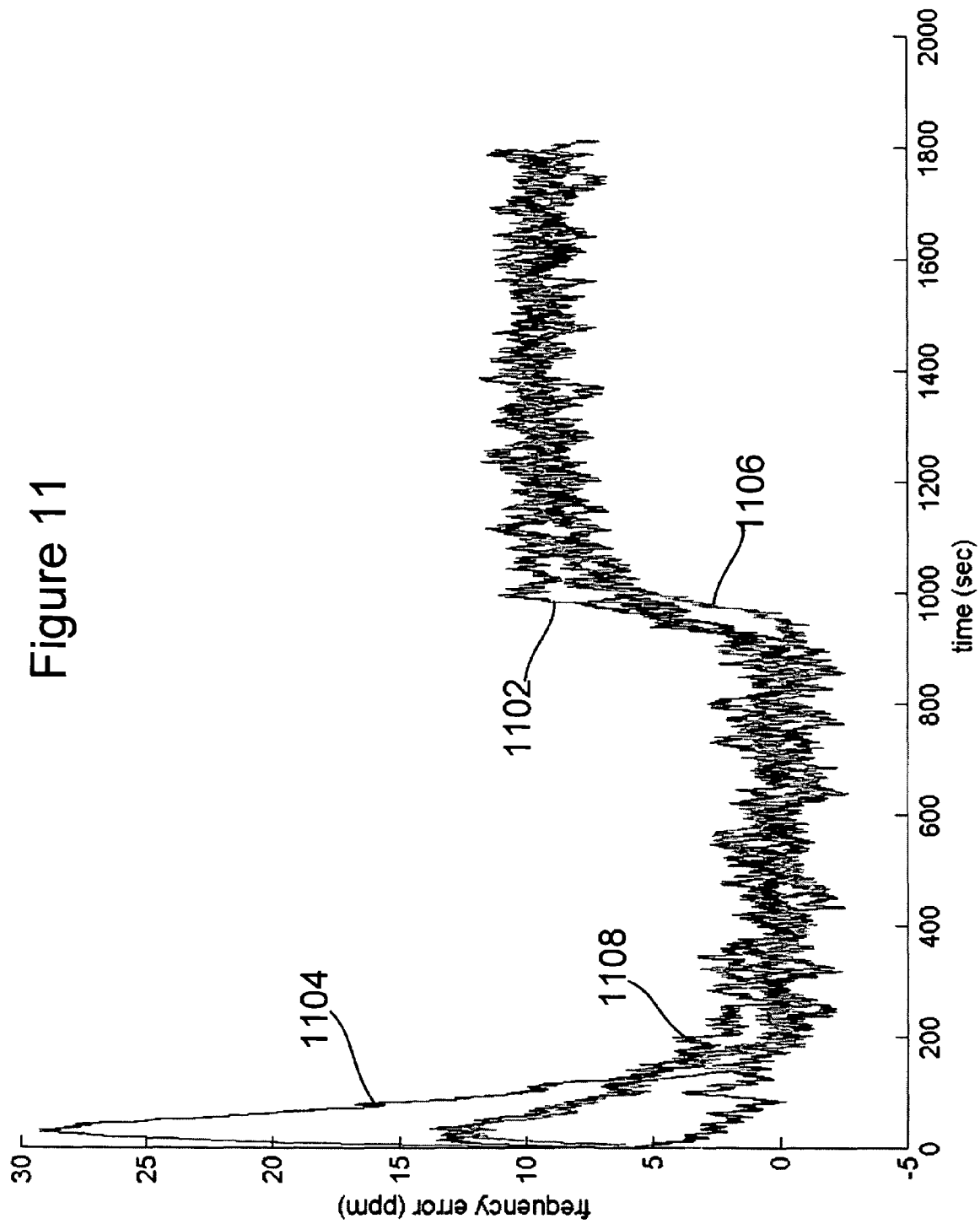
FIG. 11 illustrates the frequency errors of yet another loop filter in accordance with the present invention.
Figure 12:
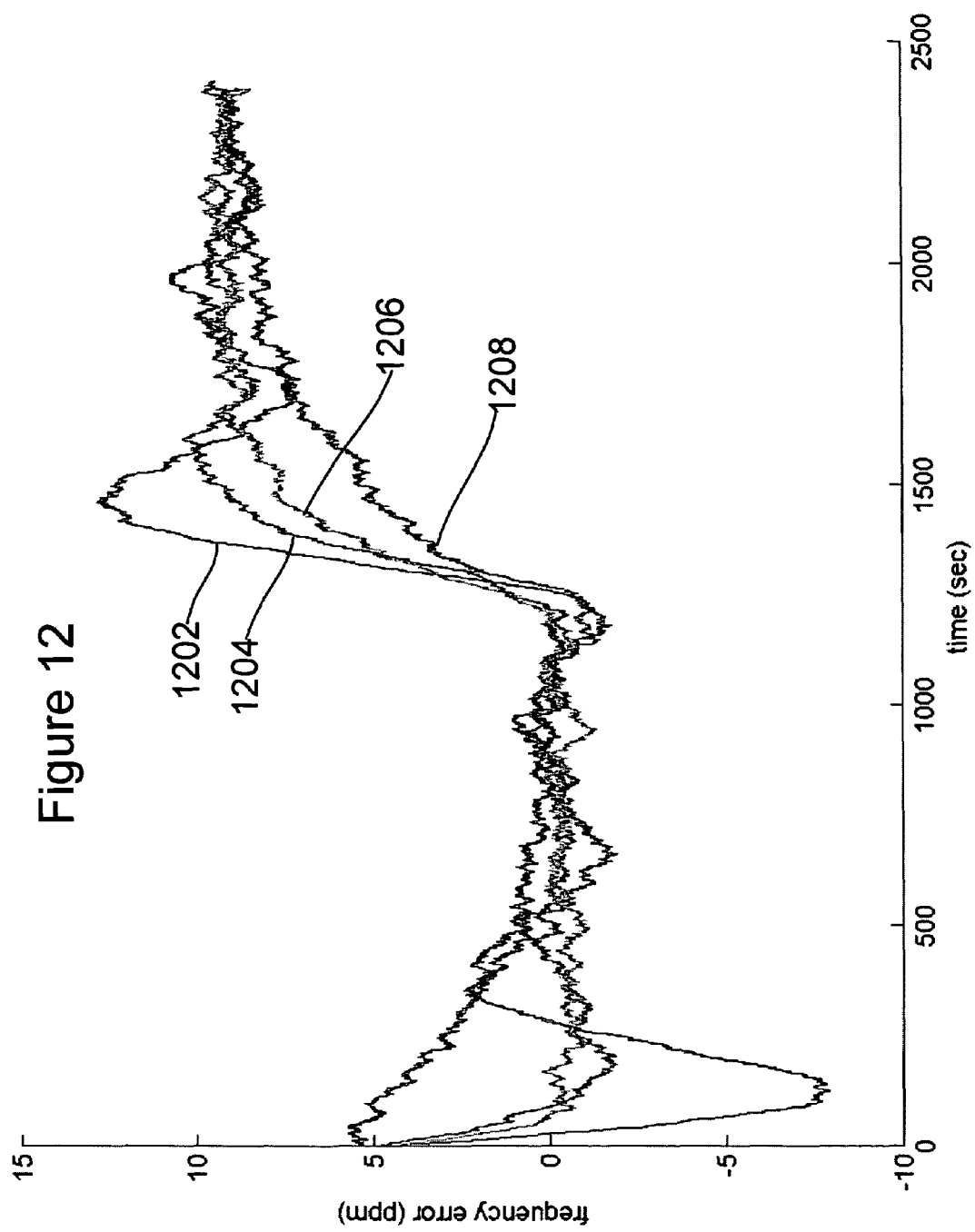
FIG. 12 illustrates the frequency errors of still another loop filter in accordance with the present invention.

According to embodiments of the invention, the $\alpha_1$ factor may also be tuned to control the loop filter's settling time. A comparison of the effects of the $\alpha_1$ factor is shown in FIGS. 9 and 10. In FIG. 9, there is shown a frequency response after a frequency step has been applied to the loop. The frequency error of the loop filter is illustrated when $\alpha_1$=0.005, $\alpha_2$=0.00001, and there is no jitter. Waveforms 902, 904, 906 and 908 show the changes in the loop filter response for the K=0, K=−0.5, K=−1.0 and K=−1.5 cases, respectively. It may be noted that the response time is approximately 180 seconds when K=0, which is the best response in FIG. 9. Changing K to +0.5 may improve the response slightly. In FIG. 10 there is shown the frequency error of the loop filter when $\alpha_1$ is lowered to 0.001 and there is no jitter. Waveforms 1002, 1004, 1006 and 1008 show the changes in the loop filter response for the K=0, K=−0.5, K=−1.0 and K=−1.5 cases, respectively. It may be noted that the response time is slowed down by approximately 210 seconds when $\alpha_1$ is lowered from 0.005 to 0.001 in the no jitter scenarios. This is, however, by design and lowering K at the same time will improve the overall performance when compared to K=0. A similar trend may be observed for high jitter scenarios as shown in FIGS. 11 and 12. In FIG. 11, there is shown the frequency error of the loop filter when $\alpha_1$0.005, $\alpha_2$=0.00001, and there is approximately 10 millisecond (ms) jitter. Waveforms 1102, 1104, 1106 and 1108 show the changes in the loop filter response for the K=0, K=−0.25, K=−0.5 and K=−1.0 cases, respectively. In FIG. 12 there is shown the frequency error of the loop filter when $\alpha_1$ is lowered to 0.001. Waveforms 1202, 1204, 1026 and 1208 show the changes in the loop filter response for the K=0, K=−1, K=−2 and K=−5 cases, respectively. It may be noted that the response time is substantially slowed down when $\alpha_1$ is lowered from 0.005 to 0.001 in the high jitter scenarios. However, by lowering $\alpha_1$, a cleaner receiver frequency may be achieved. As can be noted through a comparison between the waveforms, those in FIG. 11 show a deviation of about 3 ppm while those in FIG. 12 only show a deviation of 1 ppm.

In step 412, the parameter of the second EWMA filter may be tuned. According to embodiments of the invention, an improvement in time response may be achieved in low jitter scenarios by increasing $\alpha_2$ and selecting a proper K value. However, in high jitter scenarios, there may be little advantage in increasing $\alpha_2$ or K since it may produce a larger steady state offset to the frequency error. On the other hand, though lowering $\alpha_2$ may offer the advantage of reducing the maximum offset of the receiver clock, it may come at the cost of increasing the settling time.

Figure 13:
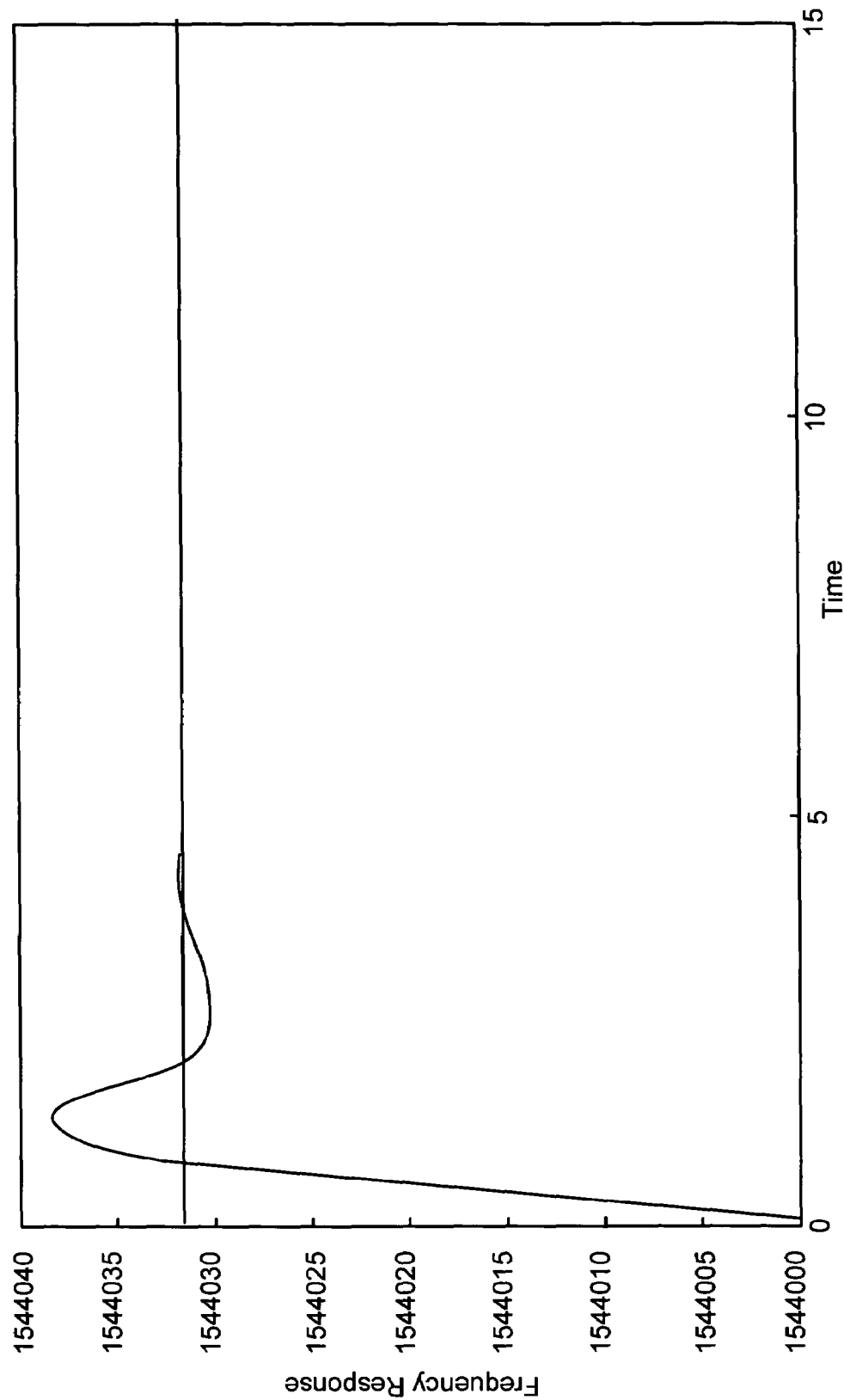
FIG. 13 illustrates a frequency response of a phase-locked loop in accordance with the present invention.

In step 414, it may be determined if a desired loop response and/or performance have been achieved. If so, the exemplary method may end in step 416. Otherwise, it may loop back to repeat steps 410 and 412. According to embodiments of the invention, it may be desirable to combine the tuning of ae, $\alpha_2$ and/or K factors in order to achieve a required loop response and performance for the loop filter. For example, if the value of $\alpha_2$ factor is lowered at the same time $\alpha_1$ and K factors are tuned to un-damp the loop response, the steady state frequency offset may be achieved without sacrificing the response time of the loop. The frequency response of a PLL incorporating a properly tuned loop filter is shown in FIG. 13. In this example, only the response of the second loop is tested where $\alpha_1$=0.001, $\alpha_2$=0.0001, and K=0. The transmitter frequency is $1.544 \times 10^6$+20 ppm Hz. As shown, the receiver clock frequency closely traces the transmitter frequency in a responsive fashion.

At this point it should be noted that the technique for filter-enhanced clock synchronization in accordance with the present invention as described above typically involves the processing of input data and the generation of output data to some extent. This input data processing and output data generation may be implemented in hardware or software. For example, specific electronic components may be employed in a computer and/or communications network or similar or related circuitry for implementing the functions associated with filter-enhanced clock synchronization in accordance with the present invention as described above. Alternatively, one or more processors operating in accordance with stored instructions may implement the functions associated with filter-enhanced clock synchronization in accordance with the present invention as described above. If such is the case, it is within the scope of the present invention that such instructions may be stored on one or more processor readable carriers (e.g., a magnetic disk), or transmitted to one or more processors via one or more signals.

The present invention is not to be limited in scope by the specific embodiments described herein. Indeed, other various embodiments of and modifications to the present invention, in addition to those described herein, will be apparent to those of ordinary skill in the art from the foregoing description and accompanying drawings. Thus, such other embodiments and modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

The invention claimed is:

1. A method for filter-enhanced clock synchronization, the method comprising:
    subjecting a clock error signal to a first exponentially weighted moving average (EWMA) filter to generate a first output signal, where the first EWMA filter comprises a first gain element; and
    subjecting the first output signal to a second EWMA filter to generate a second output signal, where the second EWMA filter comprises a second gain element;
    wherein the first EWMA filter is coupled with a first feedback loop having a first delay element and a first summing junction;
    wherein the second EWMA filter is coupled to a second feedback loop having a second delay element and a second summing junction.

2. The method according to claim 1, where at least one of the first gain element and the second gain element is a tunable gain element.

3. The method according to claim 2, further comprising tuning at least one of the first gain element and the second gain element to achieve a desired response time and performance for the second output signal.

4. The method according to claim 1, wherein the second feedback loop comprises a third gain element.

5. The method according to claim 4, where the third gain element is a tunable gain element.

6. The method according to claim 5, further comprising tuning the third gain element, in addition to the first gain element and the second gain element, to achieve a desired response time and performance for the second output signal.

7. The method according to claim 1, where the first feedback loop comprises a third gain element.

8. The method according to claim 7, where the third gain element is a tunable gain element.

9. At least one computer readable medium for storing instructions configured to be readable by at least one processor for instructing the at least one processor to execute a computer process for performing the method as recited in claim 1.

10. An apparatus for filter-enhanced clock synchronization, the apparatus comprising:
    a first exponentially weighted moving average (EWMA) filter to generate a first output signal, where the first EWMA filter comprises a first gain element; and
    a second EWMA filter to receive the first output signal and generate a second output signal, where the second EWMA filter comprises a second gain element;
    wherein the first EWMA filter is coupled with a first feedback loop having a first delay element and a first summing junction;
    wherein the second EWMA filter is coupled to a second feedback loop having a second delay element and a second summing junction.

11. The apparatus according to claim 10, where at least one of the first gain element and the second gain element is a tunable gain element.

12. The apparatus according to claim 11, where at least one of the first gain element and the second gain element is tuned to achieve a desired response time and performance for the second output signal.

13. The apparatus according to claim 10, wherein the second feedback loop comprises a third gain element.

14. The apparatus according to claim 13, where the third gain element is a tunable gain element.

15. The apparatus according to claim 14, where the third gain element is tuned, in addition to the first gain element and the second gain element, to achieve a desired response time and performance for the second output signal.

16. The apparatus according to claim 10, where the first feedback loop comprises a third gain element.

17. The apparatus according to claim 16, where the third gain element is a tunable gain element.

* * * * *